(12) United States Patent
Yu et al.

(10) Patent No.: US 9,941,904 B2
(45) Date of Patent: Apr. 10, 2018

(54) DECODING METHOD, DECODING APPARATUS, AND COMMUNICATIONS SYSTEM

(71) Applicant: Huawei Technologies Co., Ltd., Shenzhen (CN)

(72) Inventors: Fan Yu, Chengdu (CN); Deyuan Chang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 235 days.

(21) Appl. No.: 14/873,502

(22) Filed: Oct. 2, 2015

(65) Prior Publication Data

US 2016/0028417 A1   Jan. 28, 2016

Related U.S. Application Data

(63) Continuation of application No. PCT/CN2013/073699, filed on Apr. 3, 2013.

(51) Int. Cl.
*H03M 13/27* (2006.01)
*H04L 1/00* (2006.01)
(Continued)

(52) U.S. Cl.
CPC ... *H03M 13/2792* (2013.01); *H03M 13/3784* (2013.01); *H03M 13/45* (2013.01);
(Continued)

(58) Field of Classification Search
CPC ............. H03M 13/2792; H03M 13/45; H03M 13/3784; H03M 13/2957; H03M 13/1111;
(Continued)

(56) References Cited

U.S. PATENT DOCUMENTS 6,115,435 A * 9/2000 Harada ................. H04L 25/067
375/262
6,704,368 B1   3/2004 Nefedov
(Continued)

FOREIGN PATENT DOCUMENTS

CN   1863000 A   11/2006
CN   101494462 A   7/2009
(Continued)

OTHER PUBLICATIONS

Y. Do, J. Lee and S. C. Park, "Sub-Optimal Soft Decision for DCM Demodulator of MB-OFDM UWB System," 2006 International Conference on Communication Technology, Guilin, 2006, pp. 1-2.*
(Continued)

*Primary Examiner* — Cynthia Britt
(74) *Attorney, Agent, or Firm* — Slater Matsil, LLP

(57) ABSTRACT

The present invention provides a decoding method, a decoding apparatus, and a communications system, which implement multi-level coding in a manner combining soft-decision error correction coding and hard-decision error correction coding, implement multi-level decoding in a manner combining soft-decision error correction decoding and hard-decision error correction decoding, so as to integrate advantages of the two manners: compared with a manner in which soft-decision error correction coding and decoding are performed on multiple levels, a manner in which soft-decision error correction coding and decoding are performed on only one level reduces system complexity and resource overhead; and performing hard-decision error correction coding and decoding on other levels on a basis of performing soft-decision error correction coding and decoding on one level ensures gain performance, thereby meeting a gain requirement of a high-speed optical transmission system.

16 Claims, 12 Drawing Sheets

(51) Int. Cl.
  *H03M 13/37* (2006.01)
  *H03M 13/45* (2006.01)
  *H03M 13/11* (2006.01)
  *H03M 13/29* (2006.01)
  *H04L 27/06* (2006.01)

(52) U.S. Cl.
  CPC .............. *H04L 1/005* (2013.01); *H04L 1/007* (2013.01); *H04L 1/0045* (2013.01); *H03M 13/1111* (2013.01); *H03M 13/2957* (2013.01); *H04L 27/06* (2013.01)

(58) Field of Classification Search
  CPC ....... H04L 1/0045; H04L 1/007; H04L 1/005; H04L 27/06
  See application file for complete search history.

(56) References Cited

U.S. PATENT DOCUMENTS

| | | | |
|---|---|---|---|
| 7,383,487 B2 | 6/2008 | Shen et al. | |
| 2003/0039318 A1 | 2/2003 | Tong et al. | |
| 2011/0004806 A1 | 1/2011 | Adachi | |
| 2011/0010600 A1 | 1/2011 | Gong et al. | |
| 2011/0044398 A1 | 2/2011 | Dowling et al. | |
| 2015/0049844 A1* | 2/2015 | Stott | H04L 1/0041 375/298 |

FOREIGN PATENT DOCUMENTS

| | | |
|---|---|---|
| EP | 0998045 A1 | 5/2000 |
| JP | 2001086008 A | 3/2001 |

OTHER PUBLICATIONS

K. Takizawa and R. Kohno, "Analysis of iterative demapping and decoding for MBOK DS-UWB systems via EXIT chart," IEEE International Conference on Communications, 2005. ICC 2005. 2005, 2005, pp. 949-953 vol. 2.*

Linqi Song, Jun Wang, Changyong Pan and Jian Fu, "A normalized LLR soft information demapping method in DTMB system," 2008 11th IEEE Singapore International Conference on Communication Systems, Guangzhou, 2008, pp. 1297-1301.*

* cited by examiner

DECODING METHOD, DECODING APPARATUS, AND COMMUNICATIONS SYSTEM

This application is a continuation of International Application No. PCT/CN2013/073699, filed on Apr. 3, 2013, which is hereby incorporated by reference in its entirety.

TECHNICAL FIELD

The present invention relates to coding technologies in the field of information processing technologies, and in particular, to a decoding method, a decoding apparatus, and a communications system based on a modulation and decoding system.

BACKGROUND

Explosive growth of Internet services gradually boosts development of line transmission rates of an optical transport network from 40 Gbps to 100 Gbps, and then to 400 Gbps and even 1 Tbps. In a high-speed optical transmission system, a high-order modulation manner may be used to obtain higher spectral efficiency. For example, frequency-shift keying (FSK), differential phase shift keying (DPSK), quadrature amplitude modulation (QAM) or another high-order modulation manner may be used.

In an optical transmission system with a rate of or lower than 100 Gbps, modulation manners of on-off keying (OOK)/quadrature phase shift keying (QPSK) are used. A forward error correction coding (FEC) process and a modulation process in a transmitter are separately performed, so are decoding and demodulation performed in a receiver. In a next-generation higher-speed system, in order to more effectively utilize bandwidth and power, coding and modulation must be treated as an entirety, and therefore, a modulation and coding technology that is designed by combining high-order modulation and FEC coding becomes a critical technology in a high-speed optical system. Multi-level coding (MLC) is a high efficient modulation and coding scheme, which neither increases signal bandwidth nor reduces an effective data rate, thereby effectively improving data transmission performance.

In an MLC system in the prior art, a coding apparatus in a transmit end classifies bits of information into different levels, where FEC with a different bit rate is used for coding protection on each level, and then information obtained by mapping is sent to a receive end after each level is mapped to a high-order modulation constellation diagram. A decoding apparatus in the receive end separately performs FEC decoding on the different levels for bits that are obtained by demapping the received information. In a multi-level decoding (MSD) manner, information that is obtained by decoding low order bits is transferred to a demapping unit of next-level decoding, which reduces a BER of the next-level demapping, and then the next-level decoding is performed.

In the prior art, a soft-decision error correction coding (SD FEC) manner is used for each level in the MLC system. Implementation of this manner is very complex. Especially in application of a high-speed optical transmission system, an FEC overhead is subject to a greater restriction (approximately in a range of 7% to 30%). In this case, an overhead allocated to high-bit-rate FEC used to protect an MSB is very small. Highly complex SD FEC combined with a large throughout results in a very large quantity of resources for implementation of the entire system, which is not implementable.

SUMMARY

In view of this, embodiments of the present invention provide a decoding method, a decoding apparatus, and a communications system, so as to reduce complexity of implementation.

According to a first aspect, the embodiments of the present invention provide a decoding apparatus, where the decoding apparatus includes: a primary demapping unit, a soft-decision error correction decoder, a first demapping unit, a first deinterleaver, a first hard-decision error correction decoder, and an output unit;

the primary demapping unit is configured to demap information received by the decoding apparatus, and output obtained soft information of a first-level component to the soft-decision error correction decoder the soft-decision error correction decoder is configured to perform decoding according to the received soft information of the first-level component, and output the decoded soft information of the first-level component;

the first demapping unit is configured to demap, by using the soft information of the first-level component that is output by the soft-decision error correction decoder as prior information, the information received by the decoding apparatus, and output, to the first deinterleaver, hard information of a second-level component that is obtained by demapping;

the first deinterleaver is configured to deinterleave the received hard information of the second-level component, and output the deinterleaved hard information of the second-level component to the first hard-decision error correction decoder;

the first hard-decision error correction decoder is configured to decode the received hard information of the second-level component, and output the decoded hard information of the second-level component; and the output unit is configured to output hard information of the first-level component that is obtained after performing decision on the output of the soft-decision error correction decoder, and output the hard information of the second-level component that is output by the first hard-decision error correction decoder; where the first-level component is a less significant bit relative to the second-level component.

In a first possible implementation manner of the first aspect, if the number of decoding iterations used by the decoding apparatus is greater than 1, the decoding apparatus further includes a first interleaver;

the first interleaver is configured to perform interleaving processing on the hard information of the second-level component that is output by the first hard-decision error correction decoder, and output, to the primary demapping unit, the hard information of the second-level component that is obtained by means of the interleaving processing so that the primary demapping unit performs demapping of a next iteration until the number of iterations reaches a preset threshold; and the primary demapping unit is further configured to perform, by using hard information of the second-level component that is output by the first interleaver in a previous iteration as prior information, demapping of a current iteration on the first-level component of the information received by the decoding apparatus.

In a second possible implementation manner of a second aspect, the decoding apparatus further includes: a first interleaver, a second demapping unit, a second deinterleaver, and a second hard-decision error correction decoder;

the first interleaver is configured to perform interleaving processing on the hard information of the second-level component that is output by the first hard-decision error correction decoder, and output, to the second demapping unit, the hard information of the second-level component that is obtained by means of the interleaving processing;

the second demapping unit is configured to demap, by using the soft information of the first-level component that is output by the soft-decision error correction decoder and the hard information of the second-level component that is output by the first interleaver as prior information, the information received by the decoding apparatus, and output hard information of a third-level component that is obtained by means of demapping;

the second deinterleaver is configured to deinterleave the hard information of the third-level component that is output by the second demapping unit, and output, to the second hard-decision error correction decoder, the deinterleaved hard information of the third-level component;

the second hard-decision error correction decoder is configured to decode the received hard information of the third-level component, and output the decoded hard information of the third-level component; and the output unit is further configured to the hard information of the third-level component that is output by the second hard-decision error correction decoder.

With reference to the second possible implementation manner of the first aspect, if the number of decoding iterations used by the decoding apparatus is greater than 1, the decoding apparatus further includes a second interleaver;

the second interleaver is configured to perform interleaving processing on the hard information of the third-level component that is output by the second hard-decision error correction decoder, and output, to the primary demapping unit and the first demapping unit, the hard information of the third-level component and that is obtained by means of the interleaving processing so that the primary demapping unit and the first demapping unit perform demapping of a next iteration until the number of iterations reaches a preset threshold;

the first interleaver is further configured to output, to the primary demapping unit, the hard information of the second-level component that is obtained by means of the interleaving processing so that the primary demapping unit performs demapping of a next iteration until the number of iterations reaches the preset threshold;

the primary demapping unit performs, by using the hard information of the second-level component that is output by the first interleaver in a previous iteration and hard information of the third-level component that is output by the second interleaver in the previous iteration as prior information, demapping of a current iteration on the first-level component of the information received by the decoding apparatus; and the first demapping unit performs, by using the hard information of the third-level component that is output by the second interleaver in the previous iteration and soft information of the first-level component that is output by the soft-decision error correction decoder in a current iteration as prior information, demapping of the current iteration on the second-level component of the information received by the decoding apparatus.

In a third possible implementation manner of the first aspect, the decoding apparatus further includes: a first interleaver and a second demapping unit;

the first interleaver is configured to perform interleaving processing on the hard information of the second-level component that is output by the first hard-decision error correction decoder, and output, to the second demapping unit, the hard information of the second-level component that is obtained by means of the interleaving processing;

the second demapping unit is configured to demap, by using the soft information of the first-level component that is output by the soft-decision error correction decoder and the hard information of the second-level component that is output by the first interleaver as prior information, the information received by the decoding apparatus, and output hard information of a third-level component that is obtained by means of the demapping; and the output unit is further configured to output the hard information of the third-level component that is output by the second demapping unit.

With reference to the third possible implementation manner of the first aspect, if the number of decoding iterations used by the decoding apparatus is greater than 1, the first interleaver is further configured to output, to the primary demapping unit, the hard information of the second-level component that is obtained by means of the interleaving processing, so that the primary demapping unit performs demapping of a next iteration until the number of iterations reaches a preset threshold; and the second demapping unit is further configured to output, to the primary demapping unit and the first demapping unit, the hard information of the third-level component that is obtained by means of the demapping, so that the primary demapping unit and the first demapping unit perform demapping of a next iteration until the number of iterations reaches the preset threshold;

the primary demapping unit performs, by using the hard information of the second-level component that is output by the first interleaver in a previous iteration and hard information of the third-level component that is output by the second demapping unit in the previous iteration as prior information, demapping of a current iteration on the first-level component of the information received by the decoding apparatus; and the first demapping unit performs, by using the hard information of the third-level component that is output by the second demapping unit in the previous iteration and soft information of the first-level component that is output by the soft-decision error correction decoder in a current iteration as prior information, demapping of the current iteration on the second-level component of the information received by the decoding apparatus.

With reference to the first possible implementation manner, the first possible implementation manner, or the third possible implementation manner of the first aspect, the second-level component is a less significant bit relative to the third-level component.

According to a second aspect, the embodiments of the present invention provide a communications system, where the communications system includes a coding apparatus and the decoding apparatus according to the foregoing first aspect.

In a first possible implementation manner of the second aspect, the coding apparatus includes: a soft-decision error correction coder, a first hard-decision error correction coder, a first interleaver, and a mapping unit;

the soft-decision error correction coder is configured to code a first-level component of to-be-processed information, and output the coded first-level component of the to-be-processed information to the mapping unit;

the first hard-decision error correction coder is configured to code a second-level component of the to-be-processed information, and output the coded second-level component of the to-be-processed information to the first interleaver;

the first interleaver is configured to perform interleaving processing on the received second-level component, and output, to the mapping unit, the second-level component that is obtained by means of the interleaving processing; and the mapping unit is configured to perform modulation mapping on the received components of levels, and output information that is obtained after the modulation mapping.

With reference to the first possible implementation manner of the second aspect, the coding apparatus further includes: a second hard-decision error correction coder and a second interleaver;

the second hard-decision error correction coder is configured to code a third-level component of the to-be-processed information, and output the coded third-level component of the to-be-processed information to the second interleaver; and the second interleaver is configured to perform interleaving processing on the received third-level component, and output, to the mapping unit, the third-level component that is obtained by means of the interleaving processing.

With reference to the first possible implementation manner of the second aspect, an object on which the mapping unit performs the modulation mapping includes a third-level component of the to-be-processed information.

According to a third aspect, the embodiments of the present invention provide a coding method, where the coding method includes:

S1: demapping received information, so as to obtain soft information of a first-level component;

S2: performing decoding according to the received soft information of the first-level component, and outputting the decoded soft information of the first-level component;

S3: demapping the received information by using the decoded soft information of the first-level component as prior information, so as to obtain hard information of a second-level component;

S4: deinterleaving and then decoding the hard information of the second-level component, so as to obtain the decoded hard information of the second-level component; and S5: outputting hard information of the first-level component that is obtained after performing decision on the decoded soft information of the first-level component, and outputting the decoded hard information of the second-level component.

In a first possible implementation manner of the foregoing third aspect, if the number of decoding iterations used in the decoding method is greater than 1, after step S4 and before step S5, the method further includes:

S6: after performing interleaving processing on the decoded hard information of the second-level component, going to step S1 to start a next iteration until the number of iterations reaches a preset threshold, where:

during each iteration starting from a second iteration, step S1 is executed by performing demapping of a current iteration on the received information by using hard information of the second-level component that is obtained by means of interleaving processing in a previous iteration as prior information.

In a second possible implementation manner of the foregoing third aspect, after step S4 and before step S5, the method further includes:

S7: performing interleaving processing on the decoded hard information of the second-level component;

S8: demapping the received information by using the decoded soft information of the first-level component and the hard information of the second-level component that is obtained after the interleaving processing in step S7 as prior information, so as to obtain hard information of a third-level component; and S9: deinterleaving and then decoding, by a second deinterleaver, the hard information of the third-level component that is output by the second demapping unit, so as to obtain the decoded hard information of the third-level component, where:

the decoded hard information of the third-level component is further output in step S5.

With reference to the second possible implementation manner of the third aspect, if the number of decoding iterations used in the decoding method is greater than 1, after step S9 and before step S5, the method further includes:

S10: after performing interleaving processing on the decoded hard information of the third-level component, going to step S1 to start a next iteration until the number of iterations reaches a preset threshold, where:

during each iteration starting from a second iteration, step S1 is executed by performing demapping of a current iteration on the received information by using hard information of the second-level component and that is obtained by means of interleaving processing in a previous iteration and hard information of the third-level component that is obtained in step S10 in the previous iteration as prior information; and step S3 is executed by performing demapping of the current iteration on the information, received by a decoding apparatus, by using hard information of the third-level component that is obtained in step S10 in a previous iteration and decoded soft information of the first-level component that is obtained in a current iteration as prior information.

In a third possible implementation manner of the foregoing third aspect, after step S4 and before step S5, the method further includes:

S11: performing interleaving processing on the decoded hard information of the second-level component; and S12: demapping the received information by using the decoded soft information of the first-level component and the hard information of the second-level component that is obtained after the interleaving processing in step S11 as prior information, so as to obtain hard information of a third-level component, where:

the decoded hard information of the third-level component is further output in step S5.

With reference to the third possible implementation manner of the third aspect, if the number of decoding iterations used in the decoding method is greater than 1, after step S12 and before step S5, the method further includes:

going to step S1 to start a next iteration until the number of iterations reaches a preset threshold; where during each iteration starting from a second iteration, step S1 is executed by performing demapping of a current iteration on the received information by using hard information of the second-level component that is obtained by means of interleaving processing in a previous iteration and hard information of the third-level component that is obtained in step S12 in the previous iteration as prior information; and step S3 is executed by performing demapping of the current iteration on the received information by using hard information of the third-level component that is obtained in step S12 of a previous iteration and decoded soft information of the first-level component that is obtained in a current iteration as prior information.

With reference to the second or third implementation manner of the third aspect, the second-level component is a less significant bit relative to the third-level component.

It can be seen from the foregoing solutions that, according to the present invention, multi-level coding is implemented in a manner combining soft-decision error correction coding and hard-decision error correction coding, and multi-level decoding is implemented in a manner combining soft-decision error correction decoding and hard-decision error correction decoding, so as to integrate advantages of the two manners: compared with a manner in which soft-decision error correction coding and decoding are performed on multiple levels, a manner in which soft-decision error correction coding and decoding are performed on only one level reduces system complexity and resource overhead; and performing hard-decision error correction coding and decoding on other levels on a basis of performing soft-decision error correction coding and decoding on one level ensures gain performance, thereby meeting a gain requirement of a high-speed optical transmission system.

DETAILED DESCRIPTION OF ILLUSTRATIVE EMBODIMENTS

To make the objectives, technical solutions, and advantages of the present invention clearer, the following describes the present invention in detail with reference to the accompanying drawings and the embodiments.

In the embodiments of the present invention, a coding apparatus in a communications system codes a first-level component of to-be-processed information in a manner of soft-decision error correction coding, codes a second-level component of the to-be-processed information in a manner of hard-decision error correction coding, and then maps and outputs all levels of coded components. Information output by the coding apparatus is transmitted through a channel and arrives at a decoding apparatus; and the decoding apparatus demaps and decodes, in a manner of soft-decision error correction decoding, the first-level component of the information received by the decoding apparatus, demaps and decodes, in a manner of hard-decision error correction decoding, the second-level component of the information received by the decoding apparatus, and uses a decoding result of another level of component as prior information during demapping of each level of component. In addition, besides the foregoing two levels, the to-be-processed information may be further classified into more levels, for example, there may be a third-level component and a fourth-level component. Apart from the first-level component and the second-level component, another level of component is coded and decoded both in a hard-decision error correction manner; or is not coded and decoded but is only mapped in the coding apparatus and demapped in the decoding apparatus.

The following describes in detail, by using several embodiments, a system, an apparatus, and a method provided in the present invention.

Embodiment 1

High-order modulation mapping causes different bit error rates to bits at different locations in a symbol. For example, in 16QAM Gray (Gray) mapping, a bit error rate (BER, Bit Error Rate) of least significant bits (LSB, Least Significant Bit) $b0b2$ is twice that of most significant bits (BER, Most Significant Bit) $b1b3$. A core idea of MLC is to protect different information bits by using component codes with different rates, thereby implementing optimization of overall performance. LSBs that are prone to error are protected by using low-bit-rate FEC having a higher error correction capability; and MSBs are protected by using high-bit-rate FEC having a lower error correction capability because a larger Euclidean distance exists between the MSBs.

Figure 2:
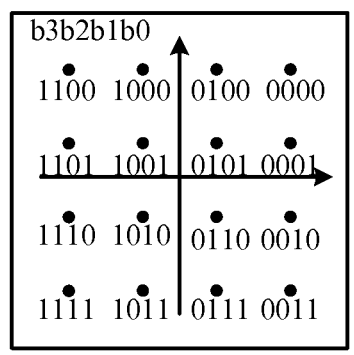
FIG. 2 is a mapping diagram based on natural segmentation mapping according to Embodiment 1 of the present invention.

This embodiment is described by using 16QAM as an example. In this case, each 4-bit symbol in to-be-processed information is classified into two levels, and every two bits are classified into one level. Herein, bit classification is related to a modulation mapping manner. A mapping relationship in the embodiment is shown in FIG. 2, where $b0$, $b1$, $b2$, and $b3$ are in a low-to-high bit sequence. That is, in the embodiment of the present invention, when all levels of components are obtained by classification, generally, a first-level component is a less significant bit having a higher bit error rate relative to a second-level component, the second-level component is a less significant bit having a higher bit error rate relative to a third-level component, and by analogy, this principle is used in all subsequent embodiments, and details are not described again. Therefore, in the embodiment, the first-level component is bits $b0$ and $b2$, which is subsequently represented by using $b0/b2$, and the second-level component is bits $b1$ and $b3$, which is subsequently represented by using $b1/b3$.

Figure 1:
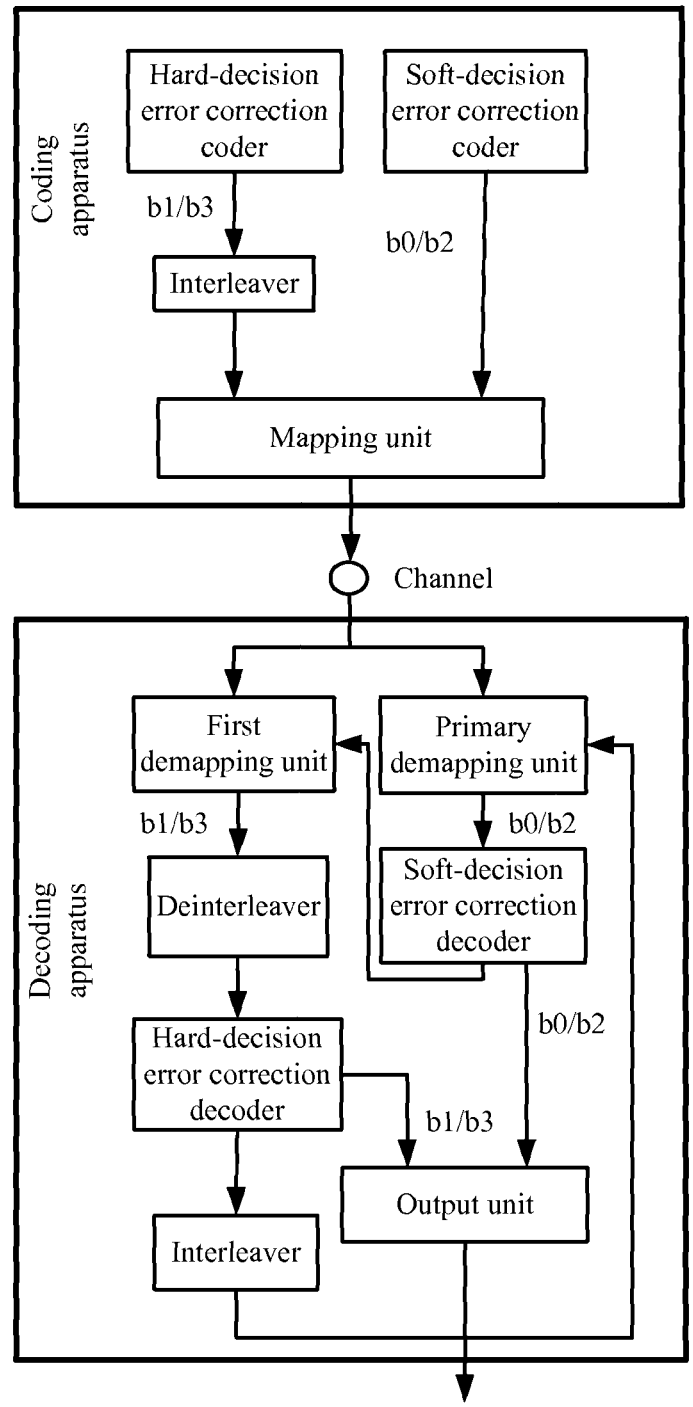
FIG. 1 is a schematic diagram of a communications system according to Embodiment 1 of the present invention.

FIG. 1 is a schematic diagram of a communications system based on a modulation and coding system according to Embodiment 1 of the present invention, where a coding apparatus may be disposed at a transmit end of information, and a decoding apparatus may be disposed at a receive end of information. The following separately describes the coding apparatus and the decoding apparatus in the communications system based on a modulation and coding system. As shown in FIG. 1, the coding apparatus includes: a soft-decision error correction coder, a hard-decision error correction coder, an interleaver, and a mapping unit.

In addition, it should be noted that a bit classification unit may also be included in the coding apparatus, and is configured to perform bit classification on to-be-processed information, and in the embodiment, to classify the information into a first component b0/b2 and a second component b1/b3, and then respectively sends them to the soft-decision error correction coder and the hard-decision error correction coder. Certainly, because the bit classification unit may also be an independent unit that is located outside the coding apparatus, the bit classification unit is not shown in FIG. 1. This is true in all subsequent embodiments, and bit classification performed on to-be-processed information by a bit classification unit differs from the embodiment only in the number of levels, and details are not described in the subsequent embodiments again.

Processing on the first-level component b0/b2 of the to-be-processed information is that: the soft-decision error correction coder codes b0/b2 of the to-be-processed information, where the soft-decision error correction coder uses SD FEC coding, and may use, but is not limited to, an LDPC coder, a Turbo coder, or the like; then, the soft-decision error correction coder outputs b0/b2 that is obtained by coding to the mapping unit.

Processing on the second-level component b1/b3 of the to-be-processed information is that: the hard-decision error correction coder codes b1/b3 of the to-be-processed information, where the hard-decision error correction coder used in the embodiment of the present invention uses HD FEC coding, and may use, but is not limited to, an RS coder, a BCH coder, or the like; then the hard-decision error correction coder outputs the coded b1/b3 to the interleaver; and the interleaver performs interleaving processing on b1/b3 to reduce bit error diffusion when decoding is performed, and outputs b1/b3 that is obtained by means of the interleaving processing to the mapping unit.

The mapping unit performs modulation mapping on the received components of levels (which are grouped based on a same symbol), that is, b0/b2 and b1/b3, and outputs information that is obtained after the modulation mapping. In the embodiment of the present invention, the mapping unit is a 16QAM mapping unit, and as shown in FIG. 2, 16QAM modulation mapping may be performed in a mapping manner based on natural segmentation.

Figure 3:
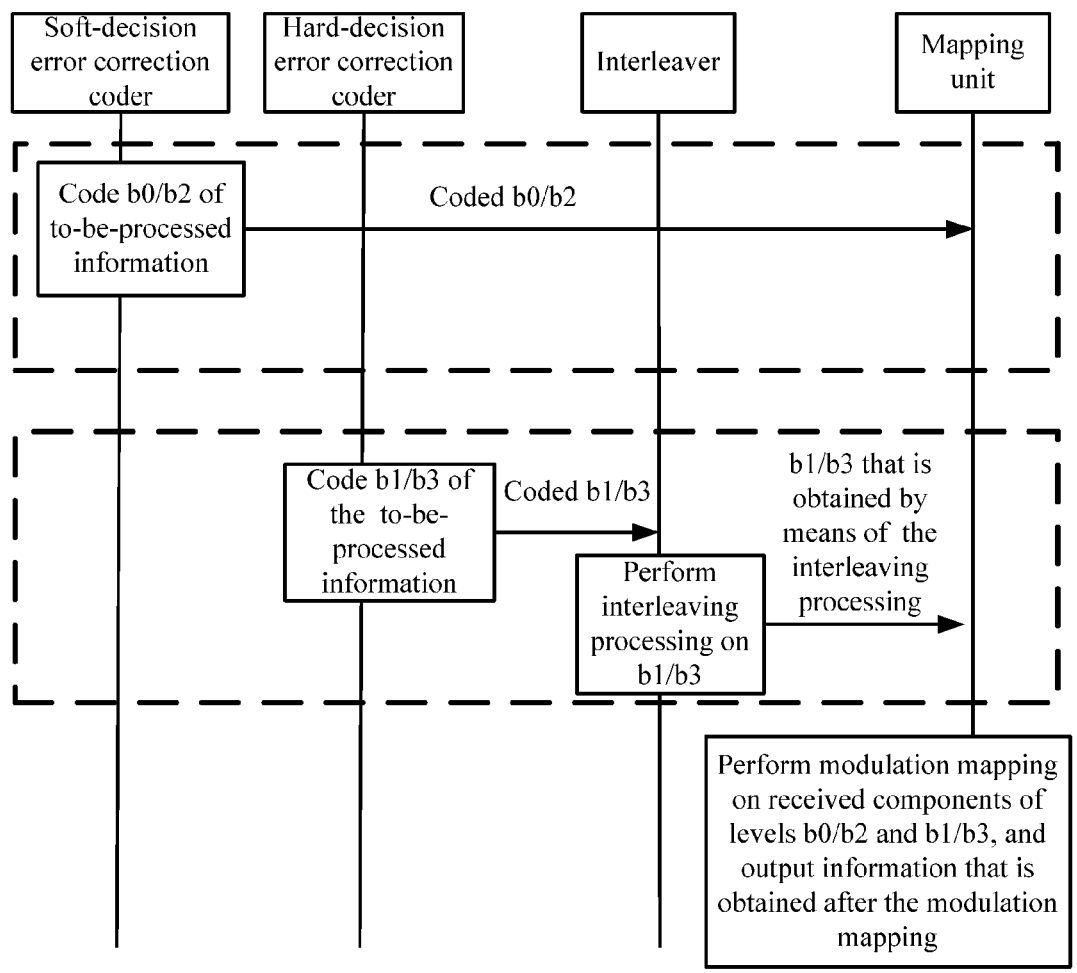
FIG. 3 is a signaling diagram of coding by a coding apparatus according to Embodiment 1 of the present invention.

A flowchart of a coding method of the foregoing coding apparatus is shown in FIG. 3, steps in two dashed-line boxes in FIG. 3 separately perform processing on two levels of components, which are generally executed concurrently.

Then, the transmit end in which the coding apparatus is located can transmit the information output by the mapping unit through, for example, a channel to the receive end, and the decoding apparatus at the receive end performs processing. Still as shown in FIG. 1, the decoding apparatus includes: a primary demapping unit, a soft-decision error correction decoder, a first demapping unit, a deinterleaver, a hard-decision error correction decoder, and an output unit.

Processing on the first-level component b0/b2 received by the decoding apparatus is that: the primary demapping unit performs b0/b2 demapping on the information received by the decoding apparatus to obtain soft information of b0/b2, and outputs the soft information of b0/b2 to the soft-decision error correction decoder, where in the embodiment of the present invention, soft information refers to log likelihood ratio (LLR, Log Likelihood Ratro) information; and the soft-decision error correction decoder performs decoding by using the soft information of b0/b2, and outputs the decoded soft information of b0/b2.

Processing on the second-level component b1/b3 received by the decoding apparatus is that: an input end of the first demapping unit has a connection relationship with an output end of the soft-decision error correction decoder; the first demapping unit performs, by using the soft information of b0/b2 that is output by the soft-decision error correction decoder as prior information (which may be used as known correct information to correct or participate in demodulation calculation), b1/b3 demapping on the information received by the foregoing decoding apparatus, and outputs hard information of b1/b3 that is obtained by means of the demapping to the deinterleaver, where the demapping performed herein actually is calculating, in an auxiliary manner, posterior probabilities of b1 and b3 by using an LLR of b0 and an LLR of b2 as prior information, so as to obtain bit information of b1/b3 by means of demodulation, and hard information involved in the embodiment of the present invention is bit information; and then the deinterleaver deinterleaves the hard information of b1/b3, and outputs the deinterleaved hard information of b1/b3 to the hard-decision error correction decoder; and the hard-decision error correction decoder decodes the hard information of b1/b3, and outputs the decoded hard information of b1/b3.

A specific algorithm in the primary demapping unit may be as follows:

A specific algorithm in the primary demapping unit is as follows:

Because 16QAM is symmetrical modulation mapping, information coming from a channel may be classified into Rx and Ry that are IQ-symmetrical, and a posterior probability is calculated. p(M/N) is a posterior probability that condition M is true when N is received, where a value of N is Rx or Ry, for example, $p(b0=0/Rx)$ is a posterior probability that $b0=0$ when Rx is received; and $p(b1b0=00/Rx)$ is a posterior probability that $b1b0=00$ when Rx is received. Meanings of other items are similar.

$$p(b0=0/Rx)=p(b1b0=00/Rx)+p(b1b0=10/Rx)$$

$$p(b0=1/Rx)=p(b1b0=01/Rx)+p(b1b0=11/Rx)$$

$$p(b2=0/Ry)=p(b3b2=00/Ry)+p(b3b2=10/Ry)$$

$$p(b2=1/Rx)=p(b3b2=01/Ry)+p(b3b2=11/Ry)$$

Implementation of the foregoing demapping algorithm may be simplified according to an algorithm such as max log map.

A specific algorithm in the first demapping unit is as follows:

A posterior probability is calculated by using the soft information of b0/b2 that is output by the soft-decision error correction decoder as the prior information:

$$p(b1=0/Rx)=p(b1b0=01/Rx)+p(b1b0=00/Rx)*\exp(\text{LLR}(b0))$$

$$p(b1=1/Rx)=p(b1b0=11/Rx)+p(b1b0=10/Rx)*\exp(\text{LLR}(b0))$$

$$p(b3=0/Ry)=p(b3b2=01/Ry)+p(b3b2=00/Ry)*\exp(\text{LLR}(b2))$$

$$p(b3=1/Rx)=p(b3b2=11/Ry)+p(b3b2=10/Ry)*\exp(\text{LLR}(b2));$$

the soft information of b0/b2 after demapping is:

$$LLR(b1) = \log\frac{p(b1 = 0/Rx)}{p(b1 = 1/Rx)}$$

$$LLR(b3) = \log\frac{p(b3 = 0/Rx)}{p(b3 = 1/Rx)};$$

and then, hard information HD(b1) and HD(b3) of b1/b3 after demapping is respectively:

if LLR(b1)<0, HD(b1)=1; otherwise, HD(b1)=0; and
if LLR(b3)<0, HD(b3)=1; otherwise, HD(b3)=0.

If there is only one decoding iteration in the decoding apparatus, that is, a preset threshold for the number of iterations is 1, decoding processing ends here. In this case, content output by the output unit is determined by output of the soft-decision error correction decoder and output of the hard-decision error correction decoder, that is, the output of the hard-decision error correction decoder and content after performing decision on the output of the soft-decision error correction decoder. It should be noted that decision that is performed on the output of the soft-decision error correction decoder may be executed by the output unit, or may be executed by an additional existing decision unit, which is true in all the following embodiments, and details are not described again.

Figure 4:
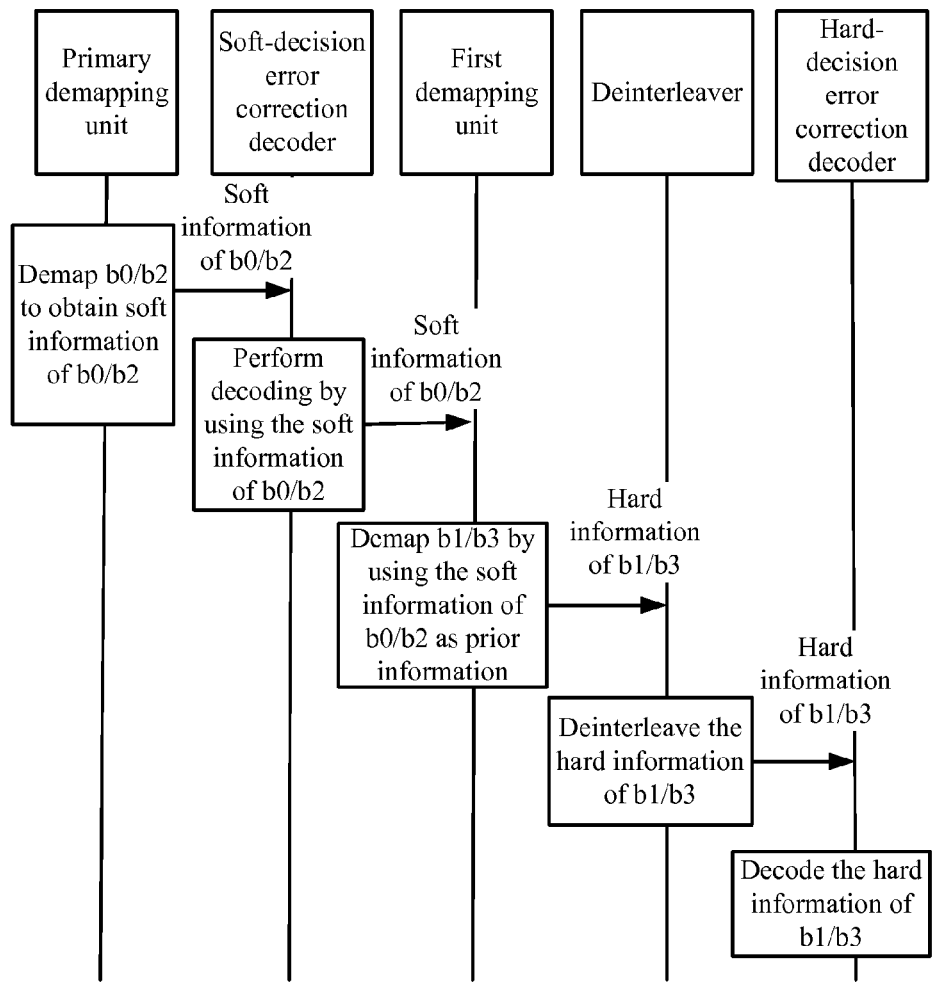
FIG. 4 is a signaling diagram of one round of decoding by a decoding apparatus according to Embodiment 1 of the present invention.

A corresponding signaling diagram of the decoding apparatus is shown in FIG. 4.

However, in many cases, there may be multiple rounds of decoding iterations in a decoding apparatus, that is, a preset threshold for the number of iterations is a value greater than 1, and multiple iterations need to be performed until the number of iterations reaches the preset threshold for the number of iterations. In this case, the foregoing process is only a decoding process of one iteration, and in order to be applicable to multiple iterations, an interleaver may be included in the decoding apparatus in this case, and the interleaver outputs, after performing interleaving processing on the hard information of b1/b3 that is output by the hard-decision error correction decoder, the hard information of b1/b3 and that is obtained by means of the interleaving processing to the primary demapping unit, so that the primary demapping unit performs demapping of a next iteration until the number of iterations reaches a preset threshold.

A process of a second iteration is as follows:

The primary demapping unit performs, by using hard information of b1/b3 that is output by the interleaver in a previous round, b0/b2 demapping of a current iteration on the information received by the decoding apparatus to obtain soft information of b0/b2; and outputs the soft information of b0/b2 to the soft-decision error correction decoder; and the soft-decision error correction decoder performs decoding by using the soft information of b0/b2, and outputs the decoded soft information of b0/b2.

The first demapping unit performs, by using the soft information of b0/b2 that is output by the soft-decision error correction decoder as prior information, b1/b3 demapping on the information received by the foregoing decoding apparatus, and outputs hard information of b1/b3 that is obtained by means of the demapping to the deinterleaver; then the deinterleaver deinterleaves the hard information of b1/b3, and outputs the deinterleaved hard information of b1/b3 to the hard-decision error correction decoder; the hard-decision error correction decoder decodes the hard information of b1/b3, and outputs the decoded hard information of b1/b3; and the interleaver performs interleaving processing on the hard information of b1/b3 that is output by the hard-decision error correction decoder, and outputs the hard information of b1/b3 that is obtained by means of the interleaving processing to the primary demapping unit, so that the primary demapping unit performs demapping of a next iteration until the number of iterations reaches a preset threshold.

A specific algorithm in the primary demapping unit during an iteration is as follows:

Posterior probabilities that are calculated by using hard information of b1/b3 that is output by the interleaver in a previous round are:

if HD(b1)=0, p(b0=0/Rx)=p(b1b0=00/Rx), and p(b0=1/Rx)=p(b1b0=01/Rx);

otherwise, p(b0=0/Rx)=p(b1b0=10/Rx), and p(b0=1/Rx)= p(b1b0=11/Rx); and if HD(b3)=0, p(b2=0/Ry)=p(b3b2=00/Ry), and p(b2=1/Rx)=p(b3b2=01/Ry);

otherwise, p(b2=0/Ry)=p(b3b2=10/Ry), and p(b2=1/Rx)= p(b3b2=11/Ry); and soft information LLR(b0) and LLR(b2) of b0/b2 after the demapping is respectively:

$$LLR(b0) = \log\frac{p(b0 = 0/Rx)}{p(b0 = 1/Rx)}$$

$$LLR(b2) = \log\frac{p(b2 = 0/Rx)}{p(b2 = 1/Rx)}.$$

Implementation of the foregoing demapping algorithm may be simplified according to an algorithm such as max log map.

Figure 5A:
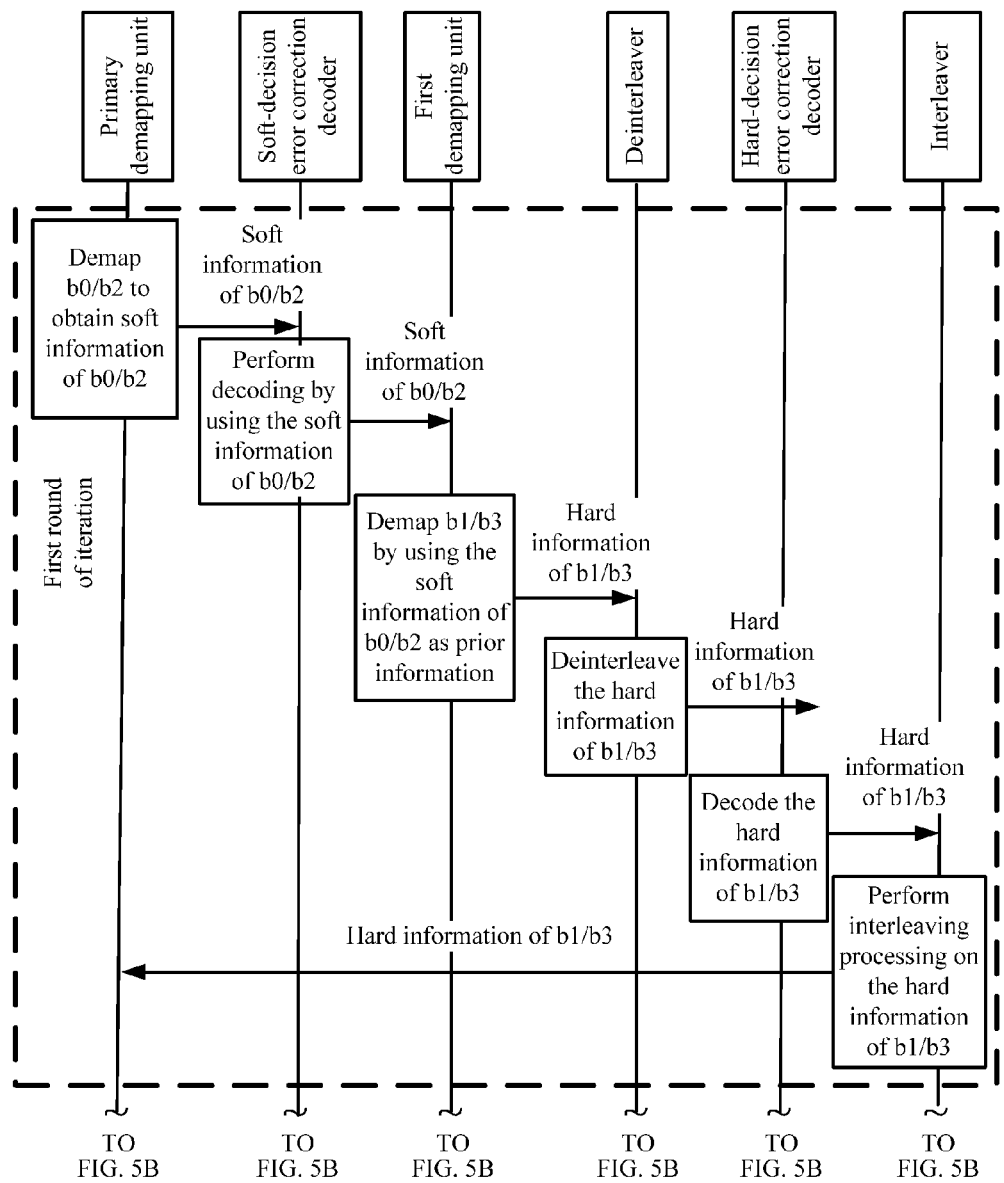
FIG. 5A and FIG. 5B are a signaling diagram of multiple rounds of decoding by a decoding apparatus according to Embodiment 1 of the present invention.
Figure 5B:
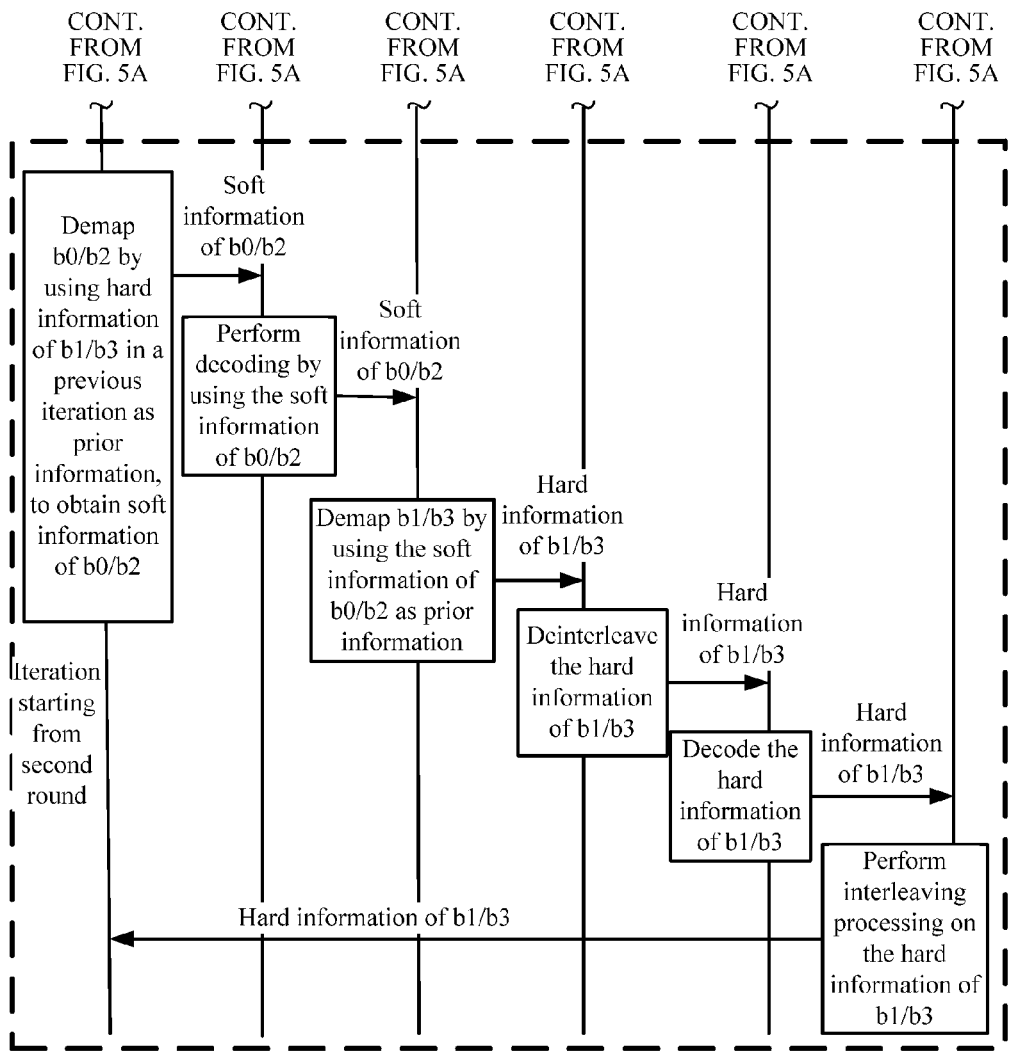

If the foregoing second iteration is included, a signaling diagram of decoding executed by the decoding apparatus is shown in FIG. 5A and FIG. 5B. A process of a subsequent round of iteration is the same as the second round, which is neither described herein again nor shown in FIG. 5A and FIG. 5B again. After the number of iterations finally reaches the preset threshold for the number of iterations, decoding processing ends. The output unit uses output of the hard-decision error correction decoder and content after performing decision on output of the soft-decision error correction decoder as content output by the decoding apparatus.

The solution in Embodiment 1 may be applied to a system upgraded from QPSK to 16QAM, where only a soft-decision error correction decoder (for example, an LDPC decoder) is used in a case of QPSK modulation, and when the system is upgraded to 16QAM, the system can be compatible with the soft-decision error correction decoder that is used in the case of QPSK, with only hard-decision resources added, and therefore, throughout is doubled while complexity is not, and upgrade costs are saved.

Embodiment 2

Figure 7:
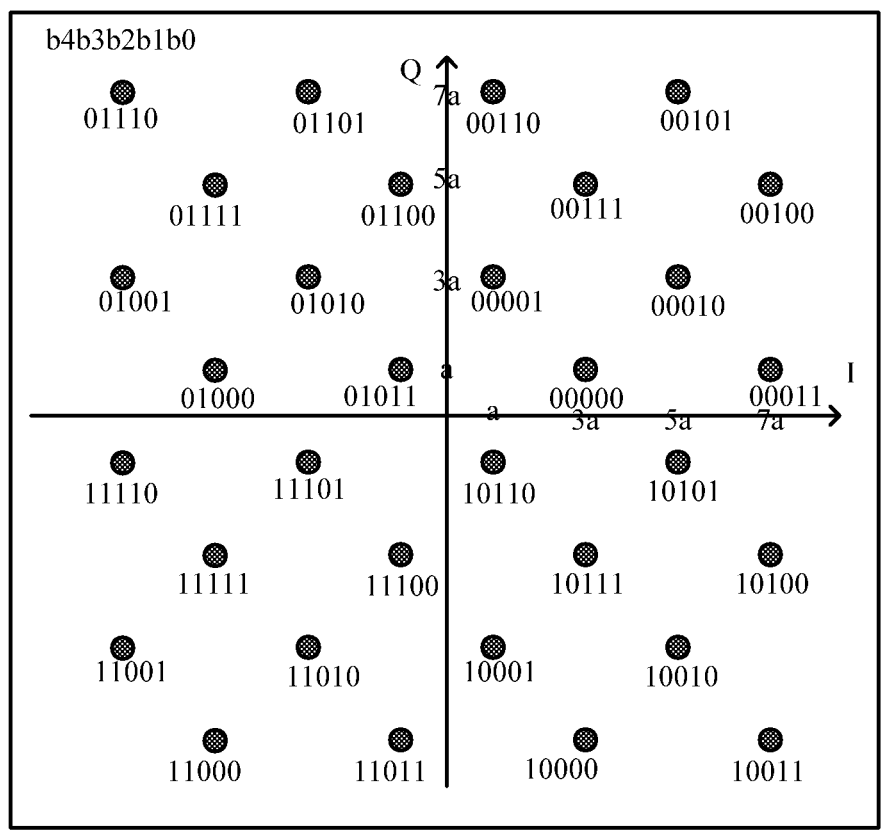
FIG. 7 is a mapping diagram based on natural segmentation mapping according to Embodiment 2 of the present invention.

This embodiment is described by using 32QAM as an example. If a mapping manner shown in FIG. 7 is used, each 5-bit symbol in to-be-processed information may be classified into 3 levels, where a first-level component is bits b0 and b1, which is subsequently represented by using b0/b1; a second-level component is bit b2; and a third-level component is bits b3 and b4, which is subsequently represented by using b3/b4. Herein, b0, b1, b2, b3, and b4 are in a low-to-high bit sequence.

Figure 6:
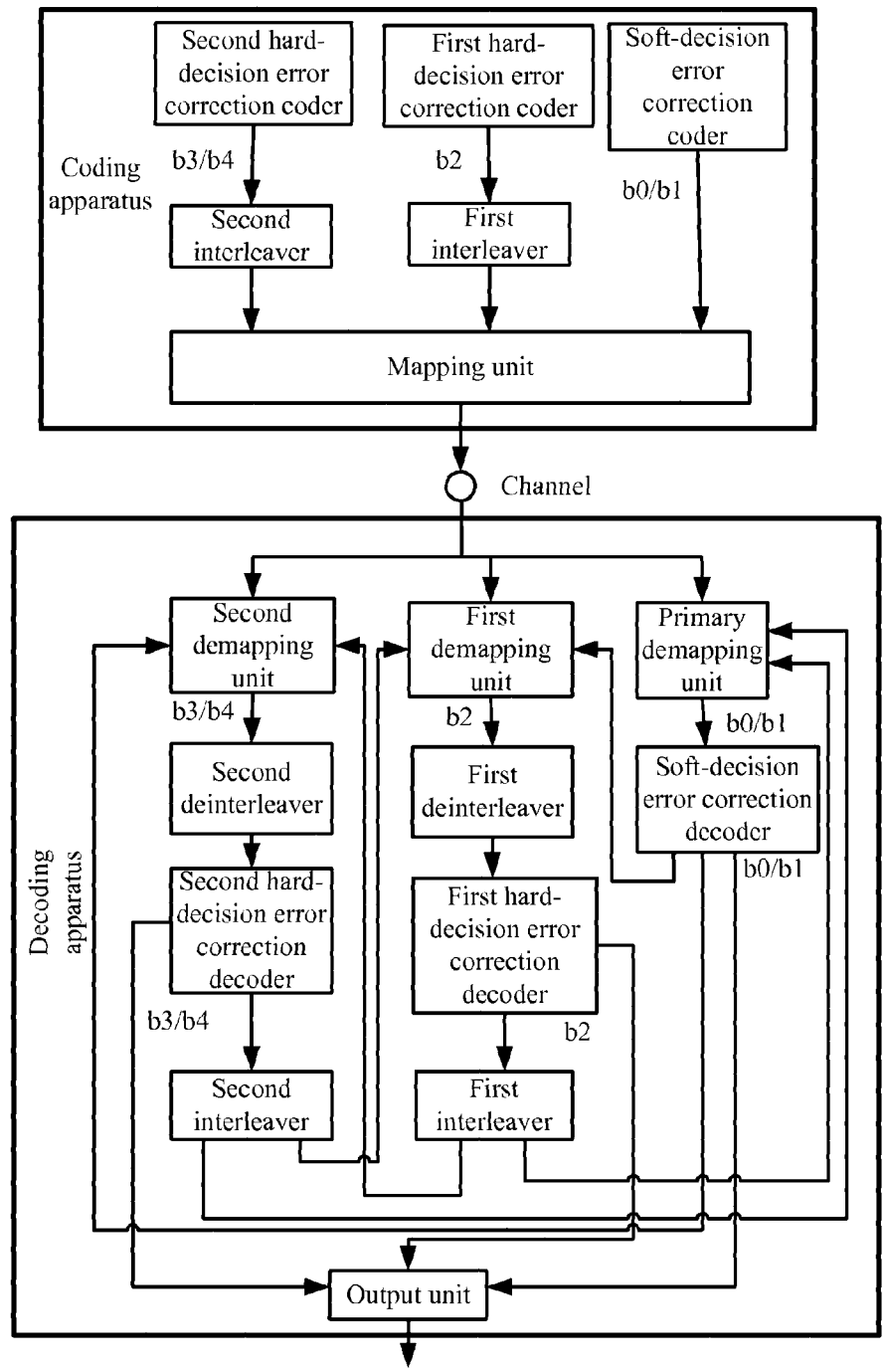
FIG. 6 is a schematic diagram of a communications system according to Embodiment 2 of the present invention.

FIG. 6 is a schematic diagram of a communications system according to Embodiment 2 of the present invention. Similarly, a coding apparatus may be disposed at a transmit end of information, and a decoding apparatus may be disposed at a receive end of information. The following separately describes the coding apparatus and the decoding apparatus in the communications system. As shown in FIG. 6, the coding apparatus includes: a soft-decision error correction coder, a first hard-decision error correction coder, a first interleaver, a second hard-decision error correction coder, a second interleaver, and a mapping unit.

Processing on the first-level component b0/b1 of the to-be-processed information is that: the soft-decision error correction coder codes b0/b1 of the to-be-processed information, where the soft-decision error correction coder uses SD FEC coding, and may use, but is not limited to, an LDPC coder, a Turbo coder, or the like; and then, the soft-decision error correction coder outputs b0/b1 that is obtained by coding to the mapping unit.

Processing on the second-level component b2 of the to-be-processed information is that: the first hard-decision error correction coder codes b2 of the to-be-processed information, where the first hard-decision error correction coder and the second hard-decision error correction coder that are used in the embodiment of the present invention use HD FEC coding, and may use, but is not limited to, an RS coder, a BCH coder, or the like; then the first hard-decision error correction coder outputs the coded b2 to the first interleaver, and the interleaver performs interleaving processing on b2 to reduce bit error diffusion when decoding is performed, and outputs b2 that is obtained by means of the interleaving processing to the mapping unit.

Processing on the third-level component b3/b4 of the to-be-processed information is that: the second hard-decision error correction coder codes b3/b4 of the to-be-processed information, then the second hard-decision error correction coder outputs the coded b3/b4 to the second interleaver, and the second interleaver performs interleaving processing on b3/b4 to reduce bit error diffusion when decoding is performed, and outputs b3/b4 that that is obtained by means of the interleaving processing to the mapping unit.

The mapping unit performs modulation mapping on the received components of levels (which are grouped based on a same symbol), that is, b0/b1, b2, and b3/b4, and outputs information that is obtained after the modulation mapping. In the embodiment of the present invention, the mapping unit is a 32QAM mapping unit; and 32QAM modulation mapping may be performed in a mapping manner based on natural segmentation, and a mapping diagram in this case may be that shown in FIG. 7.

Then, the transmit end in which the coding apparatus is located can transmit the information output by the mapping unit through, for example, a channel to the receive end, and the decoding apparatus at the receive end performs processing. Still as shown in FIG. 6, the decoding apparatus includes: a primary demapping unit, a soft-decision error correction decoder, a first demapping unit, a first deinterleaver, a first hard-decision error correction decoder, a first interleaver, a second demapping unit, a second deinterleaver, a second hard-decision error correction decoder, and an output unit.

Processing on the first-level component b0/b1 received by the decoding apparatus is that: the primary demapping unit performs b0/b1 demapping on the information received by the decoding apparatus to obtain soft information of b0/b1, and outputs the soft information of b0/b1 to the soft-decision error correction decoder, where in the embodiment of the present invention, soft information refers to LLR information; and the soft-decision error correction decoder performs decoding by using the soft information of b0/b1, and outputs the decoded soft information of b0/b1.

Processing on the second-level component b2 received by the decoding apparatus is that: an input end of the first demapping unit has a connection relationship with an output end of the soft-decision error correction decoder; the first demapping unit performs, by using the soft information of b0/b1 that is output by the soft-decision error correction decoder as prior information, b2 demapping on the information received by the foregoing decoding apparatus, and outputs hard information of b2 that is obtained by means of the demapping to the first deinterleaver, where the demapping performed herein actually is calculating, in an auxiliary manner, a posterior probability of b2 by using an LLR of b0 and an LLR of b1 as prior information, so as to obtain bit information of b2 by means of demodulation, and hard information involved in the embodiment of the present invention is bit information; then the deinterleaver deinterleaves the hard information of b2, and outputs the deinterleaved hard information of b2 to the first hard-decision error correction decoder; and the first hard-decision error correction decoder decodes the hard information of b2, and outputs the decoded hard information of b2; and the first interleaver performs interleaving on the hard information of b2 that is output by the first hard-decision error correction decoder, and outputs the hard information of b2 that is obtained by means of that is obtained by means of the interleaving.

Processing on the third-level component b3/b4 received by the decoding apparatus is that: input of the first demapping unit has a connection relationship with both output of the soft-decision error correction decoder and output of the first interleaver; the second demapping unit performs, by using the hard information of b2 that is output by the first interleaver and the soft information of b0/b1 that is output by the soft-decision error correction decoder as prior information, b3/b4 demapping on the information received by the foregoing decoding apparatus, and outputs hard information of b3/b4 that is obtained by means of demapping to the second deinterleaver; and then the deinterleaver deinterleaves the hard information of b3/b4, and outputs the deinterleaved hard information of b3/b4 to the second hard-decision error correction decoder; and the second hard-decision error correction decoder decodes the hard information of b3/b4, and outputs the decoded hard information of b3/b4.

If there is only one decoding iteration in the decoding apparatus, that is, a preset threshold for the number of iterations is 1, decoding processing ends here. Content output by the output unit is output of the first hard-decision error correction decoder, output of the second hard-decision error correction decoder, and content after performing decision on output of the soft-decision error correction decoder.

However, in many cases, there may be multiple rounds of decoding iterations in a decoding apparatus, that is, a preset threshold for the number of iterations is a value greater than 1, and multiple iterations need to be performed until the number of iterations reaches the preset threshold for the number of iterations. In this case, the foregoing process is only a decoding process of one iteration, and in order to be applicable to multiple iterations, a second interleaver may also be included in the decoding apparatus, and the second interleaver outputs, after performing interleaving processing on the hard information of b3/b4 that is output by the second hard-decision error correction decoder, the hard information of b3/b4 that is obtained by means of the interleaving processing to the primary demapping unit and the first demapping unit, so that the primary demapping unit and the first demapping unit perform demapping of a next iteration until the number of iterations reaches a preset threshold. In addition, the first interleaver further outputs the hard information of b2 that is obtained by means of the interleaving processing to the primary demapping unit, so that the primary demapping unit performs demapping of a next iteration until the number of iterations reaches the preset threshold.

A process of a second iteration is as follows:

The primary demapping unit performs, by using hard information of b2 that is output by the first interleaver in a previous round and hard information of b3/b4 that is output by the second interleaver in the previous round, b0/b1 demapping of a current iteration on the information received by the decoding apparatus to obtain soft information of b0/b1, and outputs the soft information of b0/b1 to the soft-decision error correction decoder; and the soft-decision error correction decoder performs decoding by using the soft information of b0/b1, and outputs the decoded soft information of b0/b1.

The first demapping unit performs, by using the hard information of b3/b4 that is output by the second interleaver in the previous round and soft information of b0/b1 that is output by the soft-decision error correction decoder in a current round as prior information, b2 demapping of the current round on the information received by the foregoing decoding apparatus, and outputs hard information of b2 that is obtained by means of the demapping to the first deinterleaver; then the first deinterleaver deinterleaves the hard information of b2, and outputs the deinterleaved hard information of b2 to the first hard-decision error correction decoder; and the first hard-decision error correction decoder decodes the hard information of b2, and outputs the decoded hard information of b2; and the first interleaver performs interleaving on the hard information of b2 that is output by the first hard-decision error correction decoder, and outputs the hard information of b2 that is obtained by means of the interleaving. In addition, the first interleaver outputs the hard information of b2 to the primary demapping unit, so that the primary demapping unit performs demapping of a next iteration until the number of iterations reaches the preset threshold.

The second demapping unit performs, by using the hard information of b2 that is output by the first interleaver and the soft information of b0/b1 that is output by the soft-decision error correction decoder as prior information, b3/b4 demapping on the information received by the foregoing decoding apparatus, and outputs hard information of b3/b4 that is obtained by means of the demapping to the second deinterleaver; then the second deinterleaver deinterleaves the hard information of b3/b4, and outputs the deinterleaved hard information of b3/b4 to the second hard-decision error correction decoder; the second hard-decision error correction decoder decodes the hard information of b3/b4, and outputs the decoded hard information of b3/b4; and the second interleaver performs interleaving processing on the hard information of b3/b4 that is output by the second hard-decision error correction decoder, and outputs the hard information of b3/b4 that is obtained by means of the interleaving processing to the primary demapping unit and the first demapping unit, so that the primary demapping unit and the first demapping unit perform demapping of a next iteration until the number of iterations reaches the preset threshold.

A process of a subsequent iteration is the same as the second round, which is not described again. It can be seen that, starting from the second iteration, each demapping unit has two inputs (that is, information fed back after another two levels of components are decoded) that are used as prior information. After the number of iterations finally reaches the preset threshold for the number of iterations, decoding processing ends. Output of the first hard-decision error correction decoder, output of the second hard-decision error correction decoder, and content after performing decision on output of the soft-decision error correction decoder are used as content output by the output unit.

Embodiment 3

This embodiment is described still by using 32QAM as an example, and each 5-bit symbol in to-be-processed information is still classified into 3 levels, where a first-level component is bits b0 and b1, which is subsequently represented by using b0/b1; a second-level component is bit b2; and a third-level component is bits b3 and b4, which is subsequently represented by using b3/b4. Herein, b0, b1, b2, b3, and b4 are in a low-to-high bit sequence. Unlike Embodiment 2, Embodiment 3 uses different implementation manners to perform coding and decoding on the third-level component.

Figure 8:
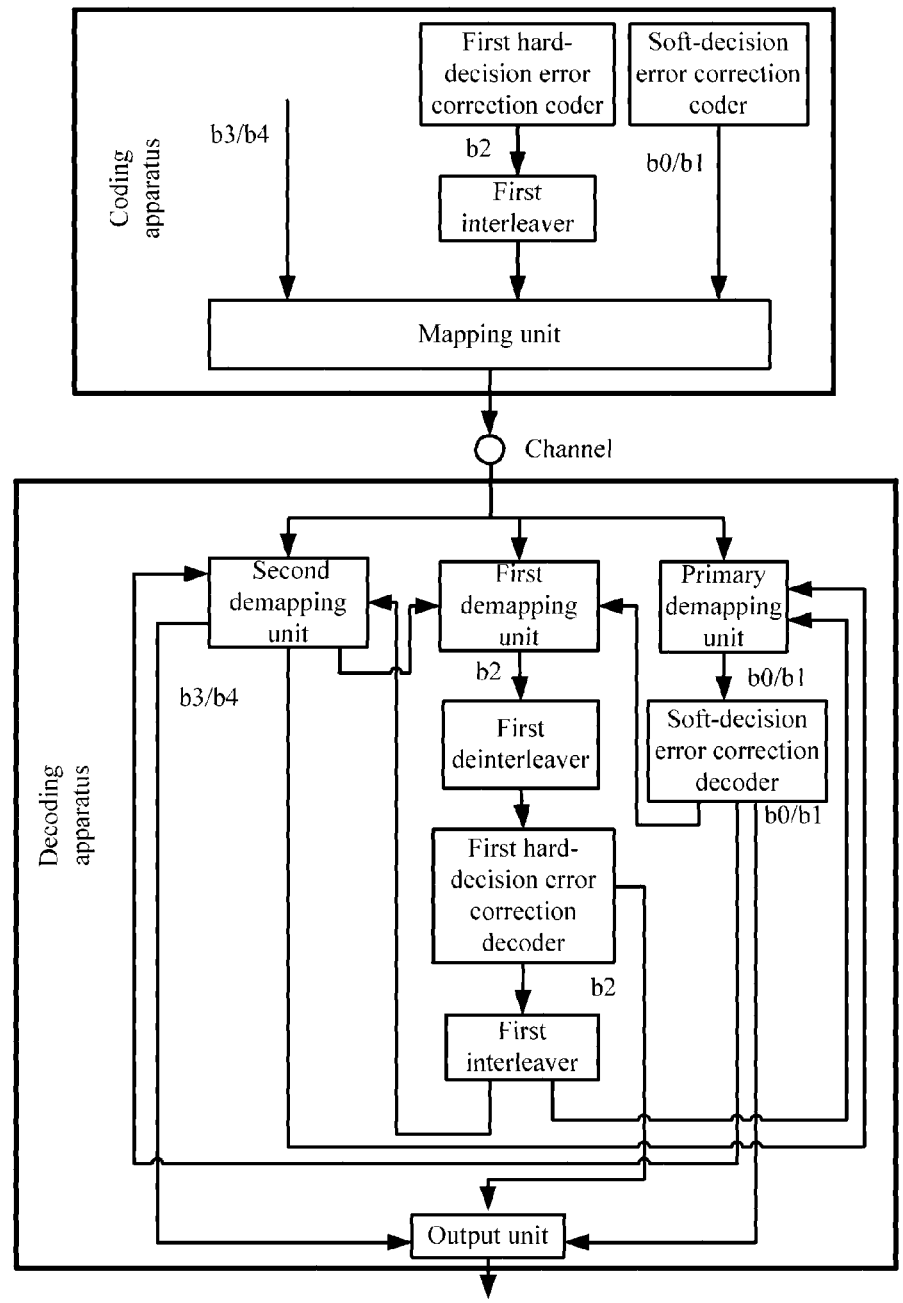
FIG. 8 is a schematic diagram of a communications system according to Embodiment 3 of the present invention.

FIG. 8 is a schematic diagram of a communications system according to Embodiment 3 of the present invention. As shown in FIG. 8, a coding apparatus includes: a soft-decision error correction coder, a first hard-decision error correction coder, a first interleaver, and a mapping unit.

In this coding apparatus, processing in the soft-decision error correction coder, the first hard-decision error correction coder, the first interleaver, and the mapping unit is the same as that described in Embodiment 2, that is, processing on the first-level component b0/b1 and the second-level component b2 of the to-be-processed information is the same as that described in Embodiment 2, which is not described herein again. However, processing on the third-level component b3/b4 of the to-be-processed information is that: the third-level component b3/b4 of the to-be-processed information is directly input into the mapping unit, that is, b3/b4 is not coded.

For a decoding apparatus, the decoding apparatus includes: a primary demapping unit, a soft-decision error correction decoder, a first demapping unit, a first deinterleaver, a first hard-decision error correction decoder, a first interleaver, a second demapping unit, and an output unit.

If there is only one iteration, processing in the primary demapping unit, the soft-decision error correction decoder, the first demapping unit, the first deinterleaver, the first hard-decision error correction decoder, the first interleaver, and the second demapping unit is the same as that described in Embodiment 2, that is, processing on the first-level component b0/b1 and the second-level component b2 that are received by the decoding apparatus is the same as that described in Embodiment 2. Processing on the third-level component b3/b4 received by the decoding apparatus is that: the second demapping unit performs, by using the hard information of b2 that is output by the first interleaver and the soft information of b0/b1 that is output by the soft-decision error correction decoder as prior information, b3/b4 demapping on the information received by the foregoing decoding apparatus, and outputs hard information of b3/b4 that is obtained by means of the demapping. When there is only one decoding iteration, content output by the output unit is output of the first hard-decision error correction decoder, output of the second demapping unit, and content after performing decision on output of the soft-decision error correction decoder.

If there are multiple rounds of decoding iterations, Embodiment 3 differs from Embodiment 2 in that: the second demapping unit outputs the hard information of b3/b4 that is obtained by means of the demapping to the primary demapping unit and the first demapping unit, so that the primary demapping unit and the first demapping unit perform demapping of a next iteration until the number of iterations reaches a preset threshold. Starting from the second iteration, the primary demapping unit performs, by using hard information of b2 that is output by the first interleaver in a previous round and hard information of b3/b4 that is output by the second demapping unit in the previous round, b0/b1 demapping of a current iteration on the information received by the decoding apparatus to obtain soft information of b0/b1; and the first demapping unit performs, by using the hard information of b3/b4 that is output by the second demapping unit in the previous round and soft information of b0/b1 that is output by the soft-decision error correction decoder in a current round as prior information, b2 demapping of the current round on the information received by the foregoing decoding apparatus. Other processing is the same as the processing process in the first round, which is not described again.

After the number of iterations finally reaches the preset threshold for the number of iterations, decoding processing ends. Output of the first hard-decision error correction decoder, output of the second demapping unit, and content after performing decision on output of the soft-decision error correction decoder are used as content output by the output unit.

Embodiment 4

Figure 9:
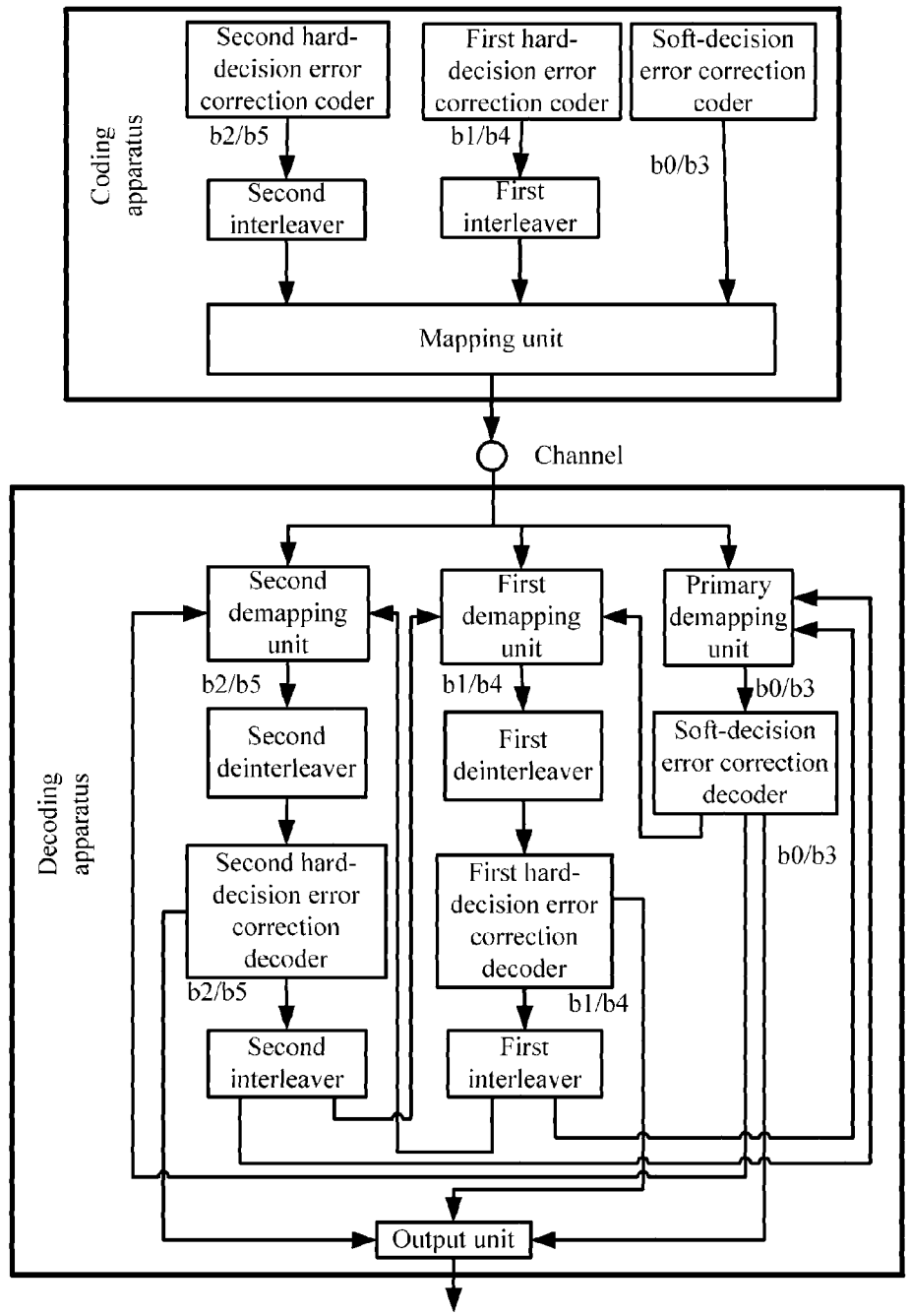
FIG. 9 is a schematic diagram of a communications system according to Embodiment 4 of the present invention.
Figure 10:
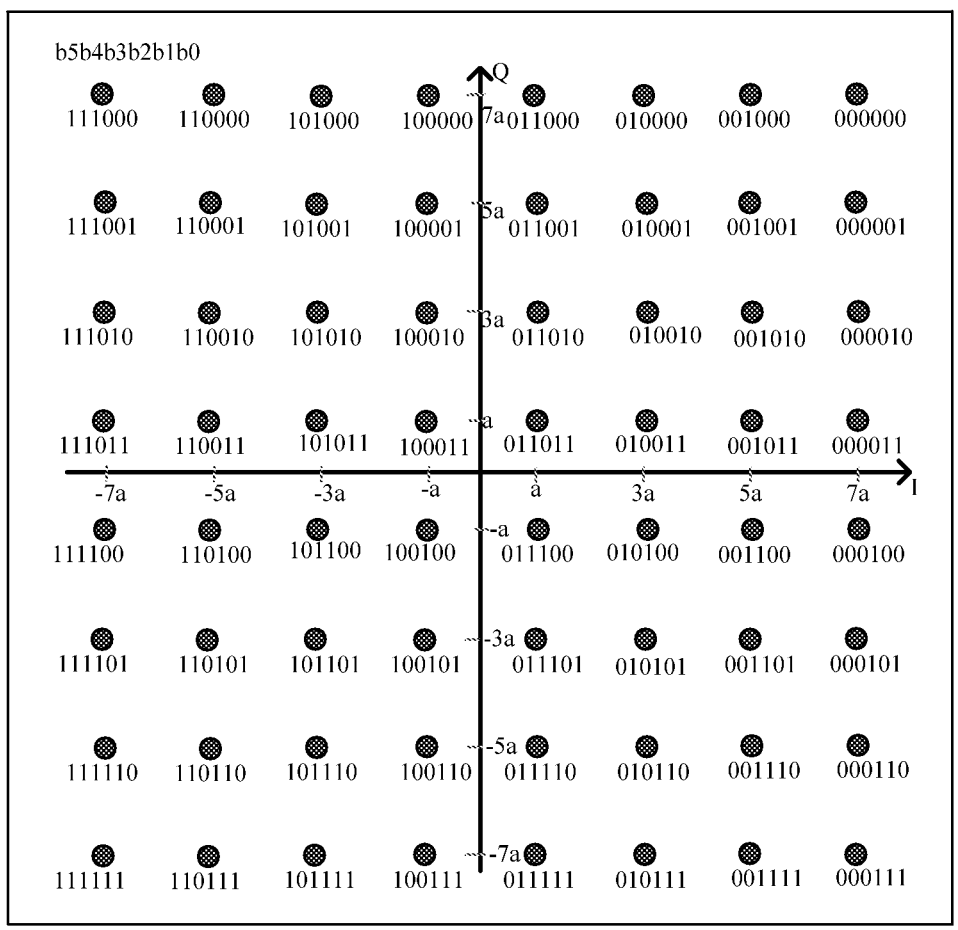
FIG. 10 is a mapping diagram based on natural segmentation mapping according to Embodiment 4 of the present invention.

This embodiment is described by using 64QAM as an example. In this case, each G-bit symbol in to-be-processed information may also be classified into three levels. A schematic diagram of a communications system in the embodiment is shown in FIG. 9, where structures of a coding apparatus and a decoding apparatus in the system are similar to those in Embodiment 2, and a manner of processing each level of component is also similar to that in Embodiment 2. In Embodiment 4, if a modulation mapping manner based on natural segmentation mapping shown in FIG. 10 is used, classification of all levels of components is: a first-level component is bits b0 and b3, which is represented in the figure by using b0/b3; a second-level component is bits b1 and b4, which is represented in the figure by using b1/b4; and a third-level component is bits b2 and b5, which is represented in the figure by using b2/b5. Herein, b0, b1, b2, b3, b4, and b5 are in a low-to-high bit sequence. That is, the first-level component is less significant bits having a higher bit error rate relative to the second-level component, and the second-level component is less significant bits having a higher bit error rate relative to the third-level component.

A specific process of processing the levels of components is not described herein again, and reference may be made to the descriptions in Embodiment 2.

Embodiment 5

Figure 11:
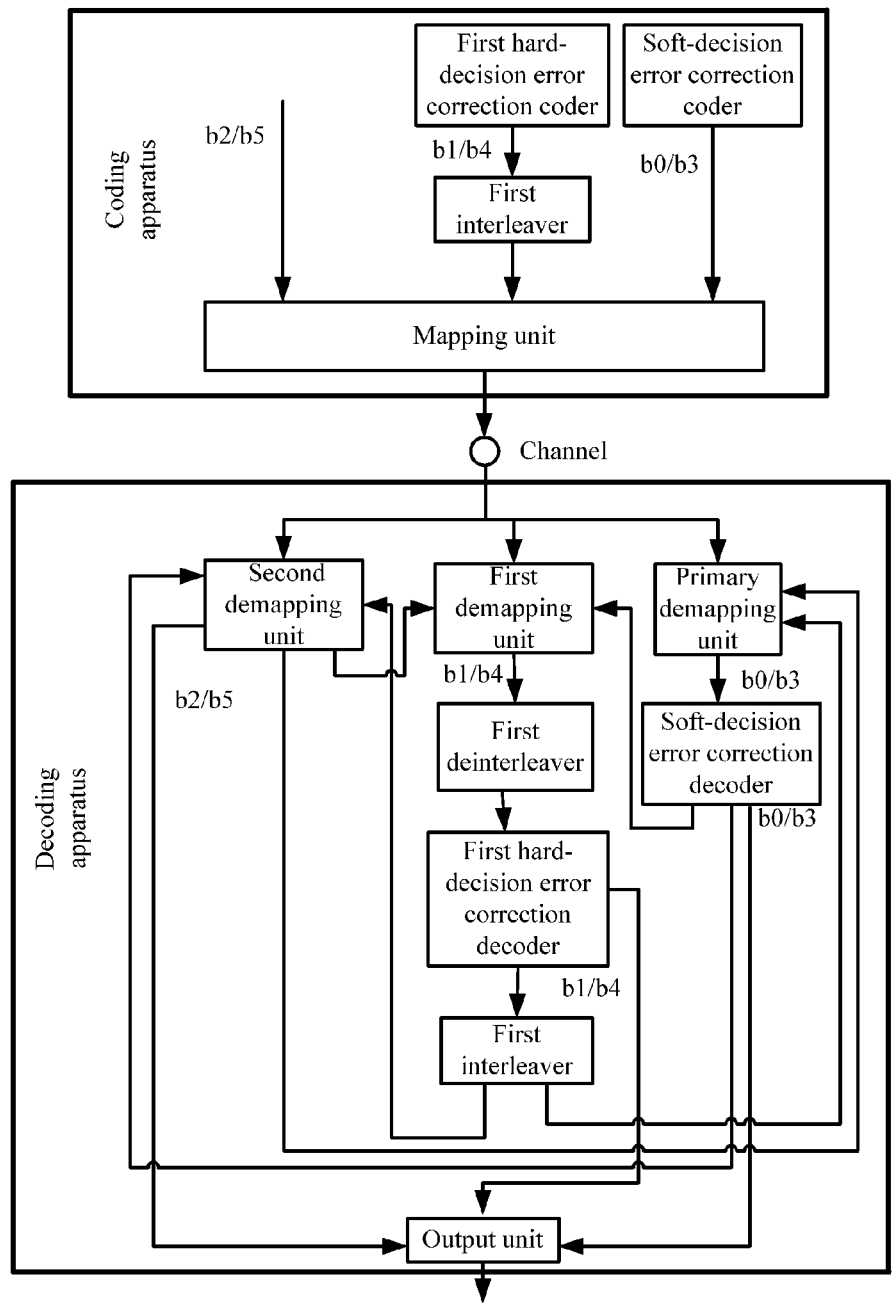
FIG. 11 is a schematic diagram of a communications system according to Embodiment 5 of the present invention.

This embodiment is described by using 64QAM as an example. In this case, each G-bit symbol in to-be-processed information may also be classified into three levels. A schematic diagram of a communications system in the embodiment is shown in FIG. 11, where structures of a coding apparatus and a decoding apparatus in the system are similar to those in Embodiment 3, and a manner of processing each level of component is also similar to that in Embodiment 3. In Embodiment 5, if a modulation mapping manner based on natural segmentation shown in FIG. 10 is used, classification of all levels of components is: a first-level component is bits b0 and b3, which is represented in the figure by using b0/b3; a second-level component is bits b1 and b4, which is represented in the figure by using b1/b4; and a third-level component is bits b2 and b5, which is represented in the figure by using b2/b5. Herein, b0, b1, b2, b3, b4, and b5 are in a low-to-high bit sequence. That is, the first-level component is less significant bits having a higher bit error rate relative to the second-level component, and the second-level component is less significant bits having a higher bit error rate relative to the third-level component.

A specific process of processing the levels of components is not described herein again, and reference may be made to the descriptions in Embodiment 3.

In the present invention, the foregoing embodiments are not intended to exhaustively list all possible situations. For example, when higher-order modulation is used, the present invention may further include a processing manner for four levels, five levels, or even more levels. For example, when 256QAM is used, each symbol includes eight bits, and may be classified into four levels of components, where a first-level component is b0 and b4, a second-level component is b1 and b5, a third-level component is b2 and b6, and a fourth-level component is b3 and b7. In the four levels of components, low-level components are coded and decoded by using SD FEC, high-level components are coded and decoded by using HD FEC, or coding is not performed but decoding is performed in a multi-level decoding manner combining SD FEC and HD FEC. The method used is similar to that in the foregoing embodiments, where more levels are processed based on the foregoing embodiments in the same implementation manner, and details are not described herein again.

It can be seen from the foregoing descriptions that, the foregoing system, apparatus, and method provided in the embodiments of the present invention have the following advantages:

1) Multi-level coding is implemented in a manner combining soft-decision error correction coding and hard-decision error correction coding, and multi-level decoding is implemented in a manner combining soft-decision error correction decoding and hard-decision error correction decoding, so as to integrate advantages of the two manners: compared with a manner where soft-decision error correction coding and decoding are performed on multiple levels, a manner where soft-decision error correction coding and decoding are performed on only one level reduces system complexity and resource overhead; and performing hard-decision error correction coding and decoding on other levels on a basis of performing soft-decision error correction coding and decoding on one level ensures gain performance, thereby meeting a gain requirement of a high-speed optical transmission system; and 2) Extension to a higher-order modulation is facilitated, meeting a use requirement of the higher-order modulation.

In the several embodiments provided in the present invention, it should be understood that the disclosed system, apparatus, and method may be implemented in other manners. For example, the described apparatus embodiments are merely exemplary. For example, the unit division is merely logical function division and may be other division in actual implementation.

The units described as separate parts may or may not be physically separate, and parts displayed as units may or may not be physical units, and may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of hardware in addition to a software functional unit.

When the foregoing integrated unit is implemented in a form of a software functional unit, the integrated unit may be stored in a computer-readable storage medium. The software functional unit is stored in a storage medium and includes several instructions for instructing a computer device (which may be a personal computer, a server, or a network device) or a processor (processor) to perform a part of the steps of the methods described in the embodiments of the present invention. The foregoing storage medium includes: any medium that can store program code, such as a USB flash drive, a removable hard disk, a read-only memory (ROM), a random access memory (RAM), a magnetic disk, or an optical disc.

The foregoing descriptions are merely exemplary embodiments of the present invention, but are not intended to limit the present invention. Any modification, equivalent replacement, or improvement made without departing from the spirit and principle of the present invention should fall within the protection scope of the present invention.

What is claimed is:

1. A decoding apparatus, wherein the decoding apparatus is included in a optical signal receiver, the decoding apparatus comprising a one or more computers including a non-transitory computer-readable medium storing program units executable by the one or more computers, the units including:
   a primary demapping unit;
   a soft-decision error correction decoder;
   a first demapping unit;
   a first deinterleaver;
   a first hard-decision error correction decoder; and
   an output unit;
   wherein the primary demapping unit is configured to demap information received by the decoding apparatus from an optical signal transmitter via an optical channel, and output obtained soft information of a first-level component to the soft-decision error correction decoder;
   wherein the soft-decision error correction decoder is configured to perform decoding according to the received soft information of the first-level component, and output the decoded soft information of the first-level component;
   wherein the first demapping unit is configured to demap, by using the soft information of the first-level component that is output by the soft-decision error correction decoder as prior information, the information received by the decoding apparatus, and wherein the first demapping unit is further configured to output, to the first deinterleaver, hard information of a second-level component that is obtained by means of the demapping;
   wherein the first deinterleaver is configured to deinterleave the received hard information of the second-level component, and wherein the first deinterleaver is further configured to output the deinterleaved hard information of the second-level component to the first hard-decision error correction decoder;
   wherein the first hard-decision error correction decoder is configured to decode the received hard information of the second-level component, and output the decoded hard information of the second-level component;
   wherein the output unit is configured to output hard information of the first-level component that is obtained after performing demapping on the output of the soft-decision error correction decoder, and output the hard information of the second-level component that is output by the first hard-decision error correction decoder;
   wherein the first-level component includes first bits from a symbol received in the information received by the decoding apparatus, and wherein the first bits are less significant than, and have a higher error rate than, second bits from the symbol and that are included in the second-level component; and
   wherein a first data throughput of the decoding apparatus having the soft-decision error correction decoder and the first hard-decision error correction decoder is greater than a second data throughput of another system solely having a soft-decision error correction decoder.

2. The decoding apparatus according to claim 1, wherein a number of decoding iterations used by the decoding apparatus is greater than 1;
   wherein the units further comprise a first interleaver configured to perform interleaving processing on the hard information of the second-level component that is output by the first hard-decision error correction decoder, and wherein the first interleaver is further configured to output, to the primary demapping unit, the hard information of the second-level component that is obtained by the interleaving processing so that the primary demapping unit performs demapping of a next iteration until the number of iterations reaches a preset threshold; and
   wherein the primary demapping unit is further configured to perform, by using hard information of the second-level component that is output by the first interleaver in a previous iteration as prior information, demapping of a current iteration on the first-level component of the information received by the decoding apparatus.

3. The decoding apparatus according to claim 1, wherein the units further comprise:
   a first interleaver;
   a second demapping unit;
   a second deinterleaver; and
   a second hard-decision error correction decoder;
   wherein the first interleaver is configured to perform interleaving processing on the hard information of the second-level component that is output by the first hard-decision error correction decoder, and wherein the first interleaver is further configured to output, to the second demapping unit, the hard information of the second-level component that is obtained by the interleaving processing;
   wherein the second demapping unit is configured to demap, by using the soft information of the first-level component that is output by the soft-decision error correction decoder and the hard information of the second-level component that is output by the first interleaver as prior information, the information received by the decoding apparatus, and output hard information of a third-level component that is obtained by the demapping;

wherein the second deinterleaver is configured to deinterleave the hard information of the third-level component that is output by the second demapping unit, and output, to the second hard-decision error correction decoder, the deinterleaved hard information of the third-level component;

wherein the second hard-decision error correction decoder is configured to decode the received hard information of the third-level component, and output the decoded hard information of the third-level component; and wherein the output unit is further configured to output the hard information of the third-level component that is output by the second hard-decision error correction decoder.

4. The decoding apparatus according to claim 3, wherein the second bits of the second-level component are less significant than, and have a higher error rate than, third bits from the symbol and that are included in the third-level component.

5. The decoding apparatus according to claim 3, wherein a number of decoding iterations used by the decoding apparatus is greater than 1;

wherein the units further comprise: a second interleaver;

wherein the second interleaver is configured to perform interleaving processing on the hard information of the third-level component that is output by the second hard-decision error correction decoder, and wherein the second interleaver is further configured to output, to the primary demapping unit and the first demapping unit, the hard information of the third-level component and that is obtained by the interleaving processing so that the primary demapping unit and the first demapping unit perform demapping of a next iteration until the number of iterations reaches a preset threshold;

wherein the first interleaver is further configured to output, to the primary demapping unit, the hard information of the second-level component that is obtained by the interleaving processing so that the primary demapping unit performs demapping of a next iteration until the number of iterations reaches the preset threshold;

wherein the primary demapping unit performs, by using the hard information of the second-level component that is output by the first interleaver in a previous iteration and hard information of the third-level component that is output by the second interleaver in the previous iteration as prior information, demapping of a current iteration on the first-level component of the information received by the decoding apparatus; and wherein the first demapping unit performs, by using the hard information of the third-level component that is output by the second interleaver in the previous iteration and soft information of the first-level component that is output by the soft-decision error correction decoder in a current iteration as prior information, demapping of the current iteration on the second-level component of the information received by the decoding apparatus.

6. The decoding apparatus according to claim 1, wherein the units further comprise:
a first interleaver; and
a second demapping unit;

wherein the first interleaver is configured to perform interleaving processing on the hard information of the second-level component that is output by the first hard-decision error correction decoder, and wherein the first interleaver is further configured to output, to the second demapping unit, the hard information of the second-level component that is obtained by the interleaving processing;

wherein the second demapping unit is configured to demap, by using the soft information of the first-level component that is output by the soft-decision error correction decoder and the hard information of the second-level component that is output by the first interleaver as prior information, the information received by the decoding apparatus, and wherein the second demapping unit is further configured to output hard information of a third-level component that is obtained by the demapping; and wherein the output unit is further configured to output the hard information of the third-level component that is output by the second demapping unit.

7. The decoding apparatus according to claim 6, wherein the number of decoding iterations used by the decoding apparatus is greater than 1;

wherein the first interleaver is further configured to output, to the primary demapping unit, the hard information of the second-level component that is obtained by the interleaving processing, so that the primary demapping unit performs demapping of a next iteration until the number of iterations reaches a preset threshold;

wherein the second demapping unit is further configured to output, to the primary demapping unit and the first demapping unit, the hard information of the third-level component that is obtained by the demapping, so that the primary demapping unit and the first demapping unit perform demapping of a next iteration until the number of iterations reaches the preset threshold;

wherein the primary demapping unit performs, by using the hard information of the second-level component that is output by the first interleaver in a previous iteration and hard information of the third-level component that is output by the second demapping unit in the previous iteration as prior information, demapping of a current iteration on the first-level component of the information received by the decoding apparatus; and wherein the first demapping unit performs, by using the hard information of the third-level component that is output by the second demapping unit in the previous iteration and soft information of the first-level component that is output by the soft-decision error correction decoder in a current iteration as prior information, demapping of the current iteration on the second-level component of the information received by the decoding apparatus.

8. A the decoding apparatus of claim 1, wherein the decoding apparatus is disposed in a communications system having a coding apparatus.

9. The communications system according to claim 8, wherein the coding apparatus comprises one or more computers including a non-transitory computer-readable medium storing program units executable by the one or more computers, the units including:
a soft-decision error correction coder
a first hard-decision error correction coder
a first interleaver; and
a mapping unit;

wherein the soft-decision error correction coder is configured to code a first-level component of to-be-processed information, and output the coded first-level component of the to-be-processed information to the mapping unit;

wherein the first hard-decision error correction coder is configured to code a second-level component of the to-be-processed information, and output the coded second-level component of the to-be-processed information to the first interleaver;

wherein the first interleaver is configured to perform interleaving processing on the received second-level component, and output, to the mapping unit, the second-level component that is obtained by the interleaving processing; and wherein the mapping unit is configured to perform modulation mapping on received components of levels, and output information that is obtained after the modulation mapping.

10. A decoding method, comprising:

demapping received information, by an optical signal receiver, so as to obtain soft information of a first-level component;

performing decoding, by the optical signal receiver, according to the soft information of the first-level component, and outputting the decoded soft information of the first-level component;

demapping, by the optical signal receiver, the information received by the optical signal receiver from an optical signal transmitter via an optical channel, by using the decoded soft information of the first-level component as prior information, so as to obtain hard information of a second-level component;

deinterleaving and decoding, by the optical signal receiver, the hard information of the second-level component, so as to obtain the decoded hard information of the second-level component; and outputting, by the optical signal receiver, hard information of the first-level component that is obtained after performing demapping on the decoded soft information of the first-level component, outputting the decoded hard information of the second-level component;

wherein the first-level component includes first bits from a symbol received in a signal of the received information, and wherein the first bits are less significant bit than, and have a higher error rate than, second bit from the symbol and that are included in the second-level component; and wherein a first data throughput of the decoding method using performing decoding according to the soft information of the first-level component and the deinterleaving and decoding the hard information of the second-level component is greater than a second data throughput of a decoding method without the deinterleaving and decoding the hard information of the second-level component.

11. The decoding method according to claim 10, wherein the number of decoding iterations used in the decoding method is greater than 1;

wherein the method further comprises, after the deinterleaving and decoding the hard information of the second-level component, and before the outputting, performing, to start a next iteration, the demapping received information, the decoding according to the soft information of the first-level component, the demapping the received information by using the decoded soft information of the first-level component as prior information and the deinterleaving and decoding the hard information of the second-level component until the number of iterations reaches a preset threshold;

wherein, during each iteration starting from a second iteration, the demapping received information is executed by performing demapping of a current iteration on the received information by using hard information of the second-level component that is obtained by interleaving processing in a previous iteration as prior information.

12. The decoding method according to claim 10, wherein the method further comprises, after the deinterleaving and decoding the hard information of the second-level component, and before the outputting:

performing interleaving processing on the decoded hard information of the second-level component;

demapping the received information by using, as prior information, the decoded soft information of the first-level component and the hard information of the second-level component that is obtained after the interleaving processing in performing interleaving processing on the decoded hard information of the second-level component, so as to obtain hard information of a third-level component; and deinterleaving and then decoding, by a second deinterleaver, the hard information of the third-level component, so as to obtain the decoded hard information of the third-level component;

wherein the decoded hard information of the third-level component is further output in the outputting.

13. The decoding method according to claim 12, wherein the number of decoding iterations used in the decoding method is greater than 1;

wherein the method further comprises, after the deinterleaving and decoding the hard information of the third-level component, and before the outputting:

after performing interleaving processing on the decoded hard information of the third-level component, performing, to start a next iteration, the demapping received information, the decoding according to the soft information of the first-level component, the demapping the received information by using the decoded soft information of the first-level component as prior information, the deinterleaving and decoding the hard information of the second-level component, the performing interleaving processing on the decoded hard information of the second-level component, the demapping the received information by using, as prior information, the decoded soft information of the first-level component and the hard information of the second-level component, and the deinterleaving and decoding the hard information of the third-level component until the number of iterations reaches a preset threshold;

wherein during each iteration starting from a second iteration, the demapping received information is executed by performing demapping of a current iteration on the received information by using hard information of the second-level component that is obtained by the interleaving processing in a previous iteration and hard information of the third-level component that is obtained in the previous iteration as prior information; and wherein the demapping the received information by using the decoded soft information of the first-level component as prior information is executed by performing demapping of the current iteration on the received information by using hard information of the third-level component that is obtained in a previous iteration and decoded soft information of the first-level component and that is obtained in a current iteration as prior information.

14. The decoding method according to claim 12, wherein the second bits of the second-level component are less significant than, and have a higher error rate than, third bits from the symbol and that are included in the third-level component.

15. The decoding method according to claim 10, wherein the method further comprises, deinterleaving and decoding the hard information of the second-level component, and before the outputting:
  performing interleaving processing on the decoded hard information of the second-level component; and
  demapping the received information by using, as prior information, the decoded soft information of the first-level component and the hard information of the second-level component that is obtained after the interleaving processing, so as to obtain hard information of a third-level component;
  wherein the decoded hard information of the third-level component is further output in the outputting.

16. The decoding method according to claim 15, wherein the number of decoding iterations used in the decoding method is greater than 1;
  wherein the method further comprises, after the demapping the received information by using, as prior information, the decoded soft information of the first-level component and the hard information of the second-level component, and before the outputting, performing, to start a next iteration, the demapping received information, the decoding according to the soft information of the first-level component, the demapping the received information, the deinterleaving and decoding the hard information of the second-level component, the performing interleaving processing on the decoded hard information of the second-level component, and the demapping the received information by using, as prior information, the decoded soft information of the first-level component and the hard information of the second-level component that is obtained after the interleaving processing until the number of iterations reaches a preset threshold;
  wherein, during each iteration starting from a second iteration, the demapping received information is executed by performing demapping of a current iteration on the received information by using hard information of the second-level component that is obtained by interleaving processing in a previous iteration and hard information of the third-level component in the previous iteration as prior information; and
  wherein the demapping the received information by using the decoded soft information of the first-level component as prior information is executed by performing demapping of the current iteration on the received information by using hard information of the third-level component that is obtained in a previous iteration and decoded soft information of the first-level component that is obtained in a current iteration as prior information.

* * * * *